(12) United States Patent
Verhaverbeke (10) Patent No.: US 7,435,686 B2
(45) Date of Patent: Oct. 14, 2008

(54) SEMICONDUCTOR PROCESSING USING ENERGIZED HYDROGEN GAS AND IN COMBINATION WITH WET CLEANING

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/582,223

(22) Filed: Oct. 16, 2006

(65) Prior Publication Data

US 2007/0037396 A1    Feb. 15, 2007

Related U.S. Application Data

(62) Division of application No. 10/927,442, filed on Aug. 26, 2004.

(51) Int. Cl.
*H01L 21/302* (2006.01)

(52) U.S. Cl. ............... 438/706; 438/637; 257/E21.255; 257/E21.579

(58) Field of Classification Search ............... 438/637, 438/706
See application file for complete search history.

(56) References Cited

U.S. PATENT DOCUMENTS

| | | | |
|---|---|---|---|
| 5,811,358 A * | 9/1998 | Tseng et al. ............... | 438/725 |
| 6,194,319 B1 * | 2/2001 | Carstensen ................ | 438/700 |
| 6,268,457 B1 | 7/2001 | Kennedy et al. | |
| 6,413,877 B1 | 7/2002 | Annapragaga | |
| 6,440,647 B1 | 8/2002 | Yakobson | |
| 6,448,185 B1 * | 9/2002 | Andideh et al. ............ | 438/706 |
| 6,696,228 B2 | 2/2004 | Muraoka et al. | |
| 6,699,330 B1 * | 3/2004 | Muraoka ................... | 134/3 |
| 2002/0011257 A1 | 1/2002 | Degendt et al. | |
| 2004/0157444 A1 | 8/2004 | Chiu et al. | |

OTHER PUBLICATIONS

PCT International Search Report and Written Opinion for PCT Application No. PCT/US2005/025822, mailed May 24, 2006 (12 pages).

\* cited by examiner

*Primary Examiner*—Alexander G Ghyka
(74) *Attorney, Agent, or Firm*—Blakely, Sokoloff, Taylor & Zafman, LLP (57) ABSTRACT

A method of fabricating a semiconductor device. The method comprises subjecting a substrate having formed thereon photoresist layer to a plasma hydrogen, the substrate further having formed thereon a sacrificial layer; contacting the photoresist layer with a photoresist removal solution; subjecting the sacrificial layer to a plasma hydrogen; and contacting the sacrificial material layer with an etchant solution.

17 Claims, 9 Drawing Sheets

SEMICONDUCTOR PROCESSING USING ENERGIZED HYDROGEN GAS AND IN COMBINATION WITH WET CLEANING

This is a Divisional of application Ser. No. 10/927,442, filed on Aug. 26, 2004, which is currently pending.

FIELD

Embodiments of the present invention relate to fabricating semiconductor devices using energized hydrogen gas in combination with wet chemistry cleaning to effectively remove a photoresist layer and/or a sacrificial fill layer.

BACKGROUND

Integrated circuits are made by forming on a semiconductor substrate layers of conductive material that are separated by dielectric (insulation) layers. Vias and/or trenches are etched in the dielectric layers and are filled with a conducting material to electrically connect the separated conductive layers. The vias and/or trenches filled with the conductive materials may be referred to as interconnects.

Photoresist materials have wide use in the semiconductor fabrication industry including masking and defining particular regions or areas on substrates or layers. Sacrificial materials have been used in making a lithographic process more uniform and efficient in the semiconductor fabrication industry. Sacrificial materials and photoresist have been used in the fabrication of semiconductor devices, for example, in dual damascene metal interconnects as sacrificial via fill material and mask for lithography process. Dual damascene metal interconnects may enable reliable low cost production of integrated circuits using sub 0.25 micron process technology. Before such interconnects can realize their full potential, however, problems related to the process for making them must be addressed. One problem involves the lithography for defining dual damascene vias and trenches. Sacrificial materials and photoresist materials are used throughout the lithography processes. The ability to remove these materials is crucial for the semiconductor processing. After the vias and trenches are formed, the sacrificial materials and the photoresist materials need to be removed without removing other layers of the device, e.g., without removing or affecting the dielectric layer and/or the surface of the silicon substrate. Additionally, photoresist materials have been used in ion implantations for making source/drain regions and/or source/drain extensions for various devices. After the source/drain regions and/or source/drain extensions are created, the photoresist materials need to be removed without affecting the substrate or other layers on the substrate.

Another problem relates to the selectivity of certain materials, which are used to make semiconductor devices and/or dual damascene devices, to the etch chemistry used to etch the vias and trenches. At times, it's crucial to remove a particular layer while not affecting another layer. Another problem yet, relates to removing the sacrificial materials and/or the photoresist materials used during processing.

SUMMARY

Exemplary embodiments of the present invention pertain to methods of fabricating semiconductor devices using energized hydrogen gas in combination with wet chemistry cleaning to effectively remove a photoresist and/or sacrificial materials. The photoresist is typically used throughout the fabrication of semiconductor devices, e.g., to make vias and trenches and to mask undoped and define doped area. The sacrificial material is also used throughout the fabrication of semiconductor devices, e.g., when making dual damascene interconnects. Alternatively, the embodiments provide methods to remove photoresist without affecting other functional layers or the substrate that the photoresist layer associates with. The embodiments provide such features using an energized hydrogen gas cleaning in combination with a wet chemistry cleaning.

In one embodiment, a method pertains to fabricating a semiconductor device which comprises creating a via in a dielectric layer formed on a substrate; filling the via, and optionally, the surface of the dielectric layer with a sacrificial material; forming and patterning a photoresist layer on the sacrificial material to define a trench for the semiconductor device; forming the trench; removing the photoresist layer after the trench is formed; and subjecting the substrate to plasma hydrogen gas for a predetermined amount of time followed by contacting a buffered hydrogen fluoride (HF) solution to the substrate to remove the sacrificial material without substantially affecting the dielectric layer.

In another embodiment, a method pertains to fabricating a semiconductor device which comprises creating a via in a dielectric layer formed on a substrate; filling the via, and optionally, the surface of the dielectric layer with a sacrificial material; forming and patterning a photoresist layer on the sacrificial material to define a trench for the semiconductor device; forming the trench; removing the photoresist layer after the trench is formed; placing the substrate in a strip module and exposing the substrate to a hydrogen plasma for a predetermined amount of time; and removing the substrate from the strip module, placing the substrate in a wet cleaning module and dispensing a hydrogen fluoride (HF) solution over the substrate. The hydrogen plasma and the HF solution remove the sacrificial material without substantially affecting the dielectric layer.

In another embodiment, a method pertains to removing a photoresist layer which comprises subjecting the photoresist layer to a plasma hydrogen; and contacting the photoresist layer with a photoresist removal solution (e.g., sulfuric acid and hydrogen peroxide mixture). In another embodiment, the method of removing the photoresist layer mentioned (subjecting the photoresist layer to a plasma hydrogen; and contacting the photoresist layer with a photoresist removal solution such as sulfuric acid and hydrogen peroxide mixture) is applied to the formation of a semiconductor device where the photoresist is used for ion implantation in the process of making source/drain regions or source/drain extension of the device. In one embodiment, a substrate is provided, a gate dielectric is formed on the substrate; a gate electrode is formed on the gate dielectric; and spacer walls are optionally formed on the sides of the gate dielectric and the gate electrode. Ion implantation is used to form source/drain regions in the substrate. In one embodiment, a p-type dopant (e.g., boron) is used to form a PMOS device (Positive Channel Metal Oxide Semiconductor device) and an n-type dopant (e.g., phosphorous, arsenic, or antimony) is used to form an NMOS device (Negative Channel Metal Oxide Semiconductor device). During the ion implantation process, a photoresist layer is used to define areas for the doping. After the ion implantation, the photoresist layer is removed by (i) subjecting the substrate to plasma hydrogen followed by (ii) contacting the photoresist layer to a photoresist removal solution such as sulfuric acid and hydrogen peroxide mixture.

In another embodiment, a method pertains to removing a sacrificial material layer which comprises subjecting the sacrificial material layer to a plasma hydrogen; and contacting the sacrificial material layer with an etchant solution (e.g., hydrogen fluoride solution).

In another embodiment, a method pertains to fabricating a semiconductor device which comprises subjecting a substrate having formed thereon photoresist layer to a plasma hydrogen, the substrate further having formed thereon a sacrificial layer; contacting the photoresist layer with a photoresist removal solution; subjecting the sacrificial layer to a plasma hydrogen; and contacting the sacrificial material layer with an etchant solution.

The embodiments also pertain to some exemplary systems that can be used to practice one or more aspects of the invention.

BRIEF DESCRIPTION OF THE DRAWINGS

The invention will be understood more fully from the detailed description given below and from the accompanying drawings of various embodiments of the invention, which, however, should not be taken to limit the invention to the specific embodiments, but are for explanation and understanding only. In the drawings.

DETAILED DESCRIPTION

In the following description, for purposes of explanation, numerous specific details are set forth. It will be evident, however, to one skilled in the art that the embodiments of present invention may be practiced without these specific details. In other instances, specific apparatus structures and methods have not been described so as not to obscure the present invention.

Exemplary embodiments of the present invention pertain to methods of fabricating semiconductor devices using energized hydrogen gas in combination with wet chemistry cleaning to effectively remove a photoresist and/or sacrificial materials. The photoresist is typically used throughout the fabrication of semiconductor devices, e.g., to make vias and trenches and to mask undoped and define doped area. The sacrificial material is also used throughout the fabrication of semiconductor devices, e.g., when making dual damascene interconnects. Examples of sacrificial materials include sacrificial light material (SLAM), ACCUFILL™ and DUO™ Spin-on sacrificial via fill materials (ACCUFILL and DUO are trademarks of Honeywell Electronic Materials), or other sacrificial material such as Bottom Anti Reflective Coating (BARC) such as AR2 BARC from by Shipley. Alternatively, the embodiments provide methods to remove photoresist without affecting other functional layers (e.g., a dielectric layer) or the substrate (e.g., silicon) that the photoresist layer associates with. The embodiments provide such features using an energized hydrogen gas cleaning in combination with a wet chemistry cleaning.

In making semiconductor devices, sacrificial materials and photoresist materials have been used, for example, in fabricating dual damascene metal interconnects. These materials have been used in making or defining dual damascene vias and trenches in conjunction with lithography processes for the semiconductor devices. Additionally, the photoresist materials have been used in doping processes where the photoresist materials are used to mask undoped area or define doped area. The ability to effectively remove these materials without affecting other functional layers is crucial for the semiconductor processing. In one embodiment, the photoresist material is removed using an energized hydrogen gas in a dry stripping module and alternatively, an energized hydrogen gas in a dry stripping module followed by a wet cleaning in a wet cleaning module using a suitable chemistry solution. Removing the photoresist material using such embodiments prevents oxidation or loss of dopants to the surface of the substrate or other layers on the substrate. In another embodiment, the sacrificial material is removed using an energized hydrogen gas in a dry stripping module followed by a wet cleaning in a wet cleaning module using a wet chemistry solution that removes oxide such as a diluted hydrogen fluoride solution.

Figure 1A:
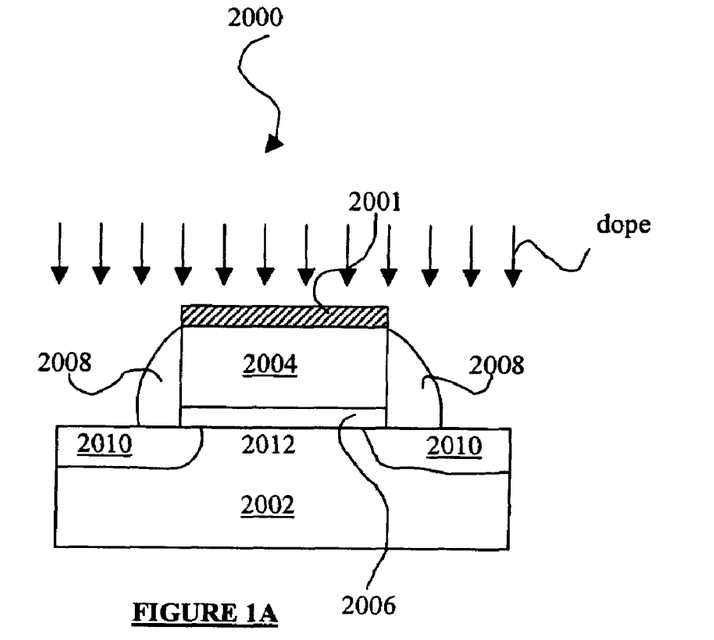
FIG. 1 illustrates an exemplary semiconductor device.

FIG. 1A illustrates a semiconductor device 2000 (e.g., a transistor) formed in a conventional manner. The device 2000 includes a substrate 2002 having a channel region 2012, source and drain regions 2010, gate dielectric 2006, gate electrode 2004, and spacer walls 2008. Methods of forming the device 2000 are well known in the art. Many processes of making the device 2000 requires the use of a photoresist layer 2001 as a mask to define exposed and non-exposed a areas. For instance, a photoresist mask may be placed over the gate electrode 2004 when an ion implantation process is taking place to form the source and drain regions 2012. After the implantation, the photoresist material needs to be removed.

In one embodiment, a photoresist mask is used to define regions on the substrate 2002 for the formation the source and drain regions 2010. In one embodiment, the device 2000 is a PMOS type of device and thus the source and drain regions 2010 are of p-type source/drain regions. In such embodiment, exemplary p-type dopants that can be to form the source/drain regions 2010 include boron, beryllium, or magnesium. In another embodiment, the device 2000 is an NMOS type of device and thus the source and drain regions 2010 are of n-type source/drain regions. In such embodiment, exemplary n-type dopants that can be to form the source/drain regions 2010 include arsenic, phosphorous, or antimony. Methods of forming the source/drain regions 2010 or the associated source/drain extension (not shown) are known in the art. In any of the conventional methods, one or more photoresist layers 2001 are used to mask and expose (or define) certain regions of the substrate 2002 so that the appropriate source/drain regions 2010 can be formed by ion implantation. After the ion implantation process, the photoresist layer is removed.

Figure 1B:
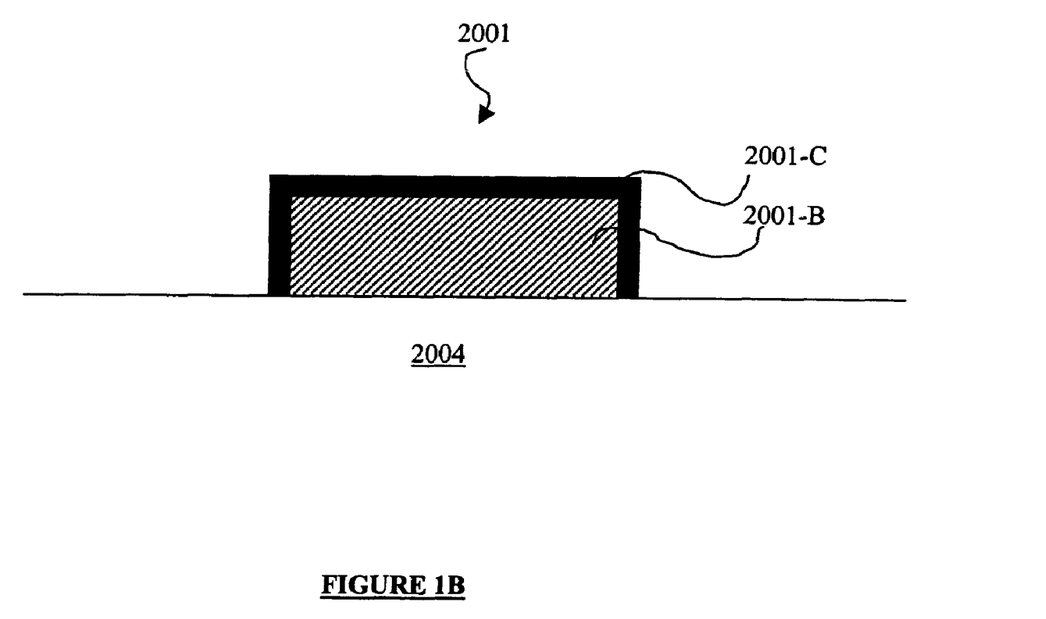

Under current technology, the photoresist material is removed using a dry strip chemistry process that utilizes oxygen plasma. It is known that the photoresist layer may become damaged or oxidized due to the various implantation processes in forming the semiconductor device 2000 such that a hard crust 2001-C is formed on the top layer of the photoresist layer 2001 (FIG. 1B). Thus, to completely remove the photoresist layer, the crust 2001-C needs to be removed as well as the bulk 2001-B of the photoresist layer. Removing both the crust 2001-C and the bulk 2001-B of the photoresist layer 2001 under the current technology causes oxidation and loss of dopants of the surface of substrate 2002 and other layers on the substrate 2002 (e.g., the gate electrode and a dielectric layer, not shown). Removing the photoresist under the current technology is known to cause oxidation to the surface of the substrate 2002 by at least about 7 angstrom under the most careful control. The oxidation in turn causes a loss of dopant in the substrate 2002 and thus affect the source and drain regions 2010 formed by ion implantation.

For semiconductor devices made using 65 nm and beyond technologies, photoresist removal without oxidation or loss of dopants on the substrate or other layers is very important. Oxidation of the substrate will lead to dopant loss and in the 65 nm and beyond technologies as the dopants are very close to the surface and thus any oxidation will lead to the dopant loss.

In one embodiment, the photoresist layer 2001 is removed using a hydrogen plasma process in a dry strip module (an exemplary embodiment of a dry strip module is described herein and below). The hydrogen plasma process does not cause oxidation to the surface of the substrate 2000 or other similar layers that may be formed on the substrate 2000. The hydrogen plasma process thus does not cause lost of dopant to the substrate 2000 or other layers. Removing the photoresist layer 2001 using the hydrogen plasma process in a dry strip module may be slower than conventionally done. In one embodiment, to speed up the photoresist removal process, a wet cleaning process utilizing a suitable wet photoresist chemistry solution, such as sulfuric acid and hydrogen peroxide mixture (SPM) solution, is used following the hydrogen plasma removal process. In one embodiment, the wet photoresist chemistry solution includes 4 parts sulfuric acid and 1 part hydrogen peroxide. The wet cleaning process takes place in a wet cleaning module in which an exemplary embodiment is described herein and below.

In one embodiment, the hydrogen plasma process removes the crust 2001-C of the photoresist layer 2001 and the wet cleaning process removes the bulk 2001-B of the photoresist layer 2001. In one embodiment, the dry strip module and the wet cleaning module are parts of an integrated tool (e.g., cluster tool), which can make the cleaning processes more efficiently.

In many embodiments, devices such as that shown in FIG. 1 need electrical interconnections to be established to the source/drain regions or the gate electrode of the devices. Vias and trenches may be created through dielectric layers to establish a connection path to the source/drain regions or the gate electrode of the devices. Additionally, many devices establish interconnection using dual damascene interconnects.

FIGS. 2-9 illustrate structures that may results from exemplary embodiments of the present invention. The embodiments are presented in the context of making a device that includes a dual damascene interconnect. These embodiments can be used for other similar semiconductor structures that may not include dual damascene interconnect or that may include other suitable interconnect.

Figure 2:
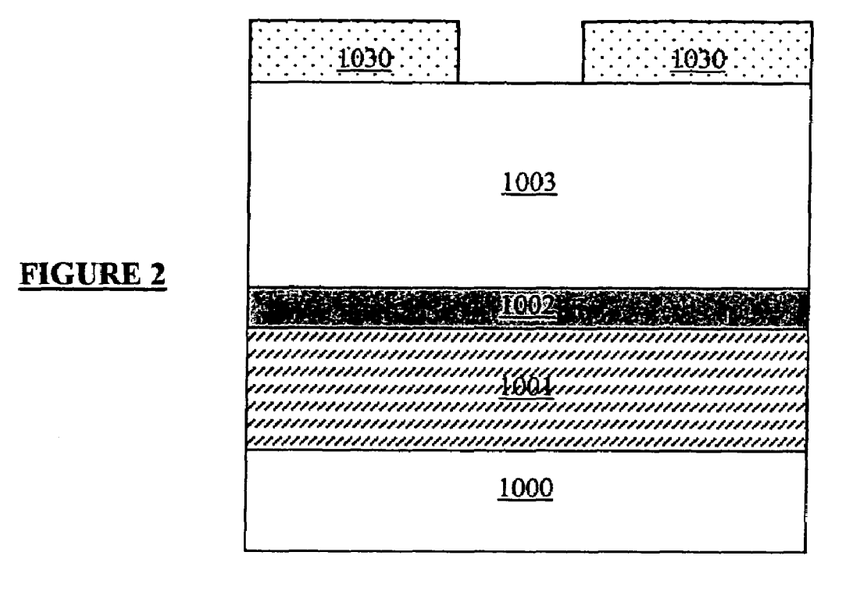
FIGS. 2-9 illustrate a cross-section of exemplary structures that may result after certain processes used to make a semiconductor device in accordance to embodiments of the present invention.

In FIG. 2, a first conductive layer 1101 is formed on a substrate 1000. The substrate 1000 may be any surface generated when making a semiconductor device or an integrated circuit, upon which a conductive layer may be formed. The substrate 1000 may be the substrate 2000 previously described in FIG. 1. The first conductive layer 1101 is typically formed to allow electrical interconnect to the device or the integrated circuit formed in the substrate 1000. The first conductive layer 1101 may be the gate electrode 2004 shown in FIG. 1 or other conductive feature communicable with the gate electrode 2004 or the source/drain regions 2010. In one embodiment, the substrate includes active and/or passive devices that are formed on a silicon wafer such as transistors, capacitors, resistors, diffused junctions, gate electrodes, local interconnects, etc . . . , such as the device 2000 shown in FIG. 1. The substrate 1000 also may include insulating materials (e.g., silicon dioxide, either undoped or doped with phosphorus (PSG) or boron and phosphorus (BPSG); silicon nitride; silicon oxynitride; or a polymer) (not shown) that separate such active and passive devices from the conductive layer or layers that are formed on top of them, and may include previously formed conductive layers. The substrate 1000 is typically made of a semiconductor material (e.g., silicon monocrystalline silicon, silicon-on-insulator, silicon-germanium or other suitable materials used in the field).

The conductive layer 1001 may be made from materials conventionally used to form conductive layers for integrated circuits such as copper, copper alloy, aluminum or an aluminum alloy, and aluminum/copper alloy. Alternatively, the conductive layer 1001 may be made from doped polysilicon or a silicide, e.g., a silicide comprising tungsten, titanium, nickel or cobalt. In one embodiment, the conductive layer 1001 includes a number of separate layers. The conductive layer 1001 may comprise a primary conductor made from an aluminum/copper alloy that is sandwiched between a relatively thin titanium layer located below it and a titanium, titanium nitride double layer located above it. The conductive layer 1001 may also comprise a copper layer formed on underlying barrier and seed layers.

In one embodiment, the conductive layer 1001 is formed by a chemical vapor. In another embodiment, the conductive layer 1001 is formed by a physical deposition process. In an embodiment where copper is used to make the conductive layer 1001, a conventional copper electroplating process may be used. Techniques for forming a conductive layer such as the conductive layer 1001 are well known to those of ordinary skilled in the art.

Also in FIG. 2, a barrier layer 1002 is formed on the conductive layer 1001. In one embodiment, the barrier layer 1002 serves to prevent an unacceptable amount of copper, or other conductive metals, from diffusing into a dielectric layer 103. The barrier layer 1002 also acts as an etch stop to prevent subsequent via and trench etch processing from exposing the conductive layer 1001 to subsequent cleaning processes. In one embodiment, the barrier layer 1002 is made from silicon nitride and in other embodiments, made from materials that can serve the functions previously mentioned. Other examples for the barrier layer 1002 include titanium nitride, silicon carbide, or silicon oxynitride.

In one embodiment, the barrier layer 1002 is formed from silicon nitride and can be formed using a chemical vapor deposition process. The barrier layer 1002 should be thick enough to perform its diffusion inhibition and etch stop functions, but not so thick that it adversely impacts the overall dielectric characteristics resulting from the combination of the barrier layer 1002 and the dielectric layer 1003. In one embodiment, the thickness of the barrier layer 1002 is less than about 10% of the thickness of the dielectric layer 103.

In one embodiment, the conductive layer 1001 and barrier layer 1002 are planarized after they are deposited. In one embodiment, the conductive layer 1001 and barrier layer 1002 are planarized using a chemical mechanical polishing (CMP).

In FIG. 2, a dielectric layer 1003 is formed on top of the barrier layer 1002. In one embodiment, the dielectric layer 1003 comprises silicon dioxide, which is deposited on the surface of the barrier layer 1002 using a conventional method such as plasma enhanced chemical vapor deposition (PECVD) process. An exemplary silicon source that can be used with the PECVD process includes tetraethylorthosilicate (TEOS) as the silicon source. In other embodiments, the dielectric layer 1003 is made from other materials that can insulate one conductive layer from another. An example of a material that can be used to make the dielectric layer 1003 include an organic polymer selected from the group that includes polyimides, parylenes, polyarylethers, polynaphthalenes, and polyquinolines, or copolymers thereof. Examples of other organic dielectric materials include SiO-based dielectric, SiOCH, SiOF, and Spin-on-SiOCH. The dielectric layer 1003 can also be made of a commercially available polymer sold by Dow Chemicals under the trade name SiLK™ or those sold by Honeywell International, Inc., under trade names FLARE™, GX3 and GX3P. The dielectric layer 1003 can also be made of an inorganic dielectric material such as fluorinated silica glass (FSG) and phosphorous doped TEOS (pTEOS). In some embodiment, the dielectric layer 1003 comprises fluorinated silicon dioxide or a porous silicon dioxide, e.g., silicon dioxide doped with carbon. Methods of making or forming the dielectric layer 1003 are known to those skilled in the art. In one embodiment, the dielectric layer 1003 is formed to have a thickness of between about 2,000 and about 20,000 angstroms.

Also in FIG. 2, after the dielectric layer 1003 is formed, a photoresist layer 1030 is deposited and patterned or defined on top of the dielectric layer 1003 to define a via formation region for receiving a subsequently formed conductive layer that will contact the first conductive layer 1001. The photoresist layer 1030 may be patterned or defined using conventional photolithographic techniques, such as masking the layer of photoresist material, exposing the masked photoresist layer to light, then developing the unexposed portions.

Figure 3:
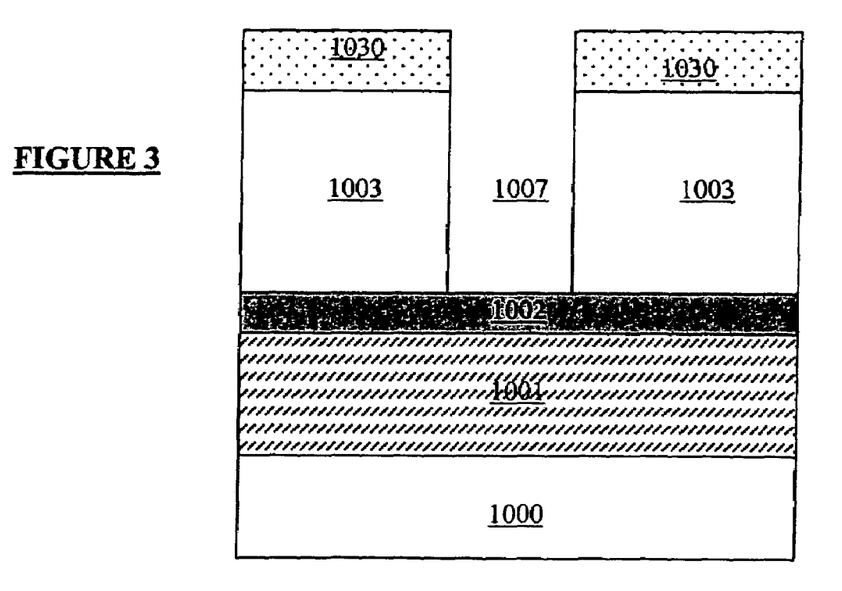

FIG. 3 illustrates that a via 1007 is formed in the dielectric layer 1003. In one embodiment, after the photoresist 1030 is patterned, the via 1007 is etched through the dielectric layer 1003 down to the barrier layer 1002. Conventional methods can be used to etch the dielectric layer 1003 to form the via 1007. An example of such a method includes an anisotropic dry oxide etch process. In an embodiment when silicon dioxide is used to form the dielectric layer 1003, the via is etched using a medium density magnetically enhanced reactive ion etching system ("MERIE system") using fluorocarbon chemistry, which is known in the art.

After the via 1007 is formed, the photoresist layer 1030 is removed. In one embodiment, the photoresist layer 1030 is removed using a hydrogen plasma process in a dry strip module. The hydrogen plasma process does not cause oxidation to the surface of the dielectric layer 1030 and/or the substrate 1000 or other similar layers (not shown) that may be formed on the substrate 1000. In one embodiment, to speed up the photoresist layer 1030 removal process, a wet cleaning process utilizing a wet resist chemistry solution, such as sulfuric acid hydrogen peroxide solution, is used following the hydrogen plasma removal process. In one embodiment, the wet resist chemistry solution includes 4 parts sulfuric acid and 1 part hydrogen peroxide. In one embodiment, the hydrogen plasma process may be used to remove the crust of the photoresist layer 1030 and the wet cleaning process removes the bulk of the photoresist layer 1030. The wet cleaning process takes place in a wet cleaning module (described below).

Figure 4:
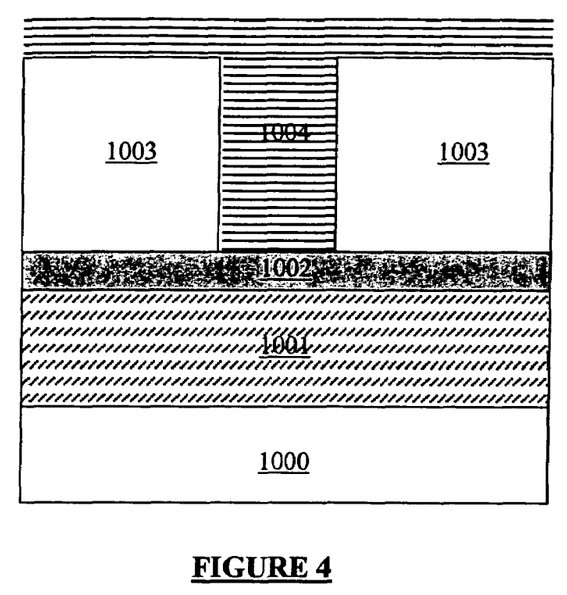

In FIG. 4, a sacrificial material is used to fill the via 1007. In one embodiment, after the via 1007 is formed through the dielectric layer 1003, the via 1007 is filled with a sacrificial material 1004. In one embodiment, the sacrificial material 1004 has dry etch properties similar to those of the dielectric layer 1003. The sacrificial material 1004 may comprise a spin-on-polymer (SOP) or spin-on-glass (SOG), a sacrificial light absorbing material (SLAM), or a similar SLAM material with a trade name DUO (made by Honeywell Electronic Materials). DUO is an organosiloxane polymer designed to absorb at 248 nm radiation. DUO is also a hybrid of oxide (SiO) structures and organic components (e.g., benzene ring, CH3 and CH2). In one embodiment, the sacrificial material 1004 is deposited by spin coating to a thickness of about 500 and about 3,000 angstroms of the material onto the surface of the device, using conventional process steps. Although only a thin layer remains on the surface of the device, such a spin coating process causes the sacrificial material 1004 to substantially, or completely, fill the via 1007.

Figure 5:
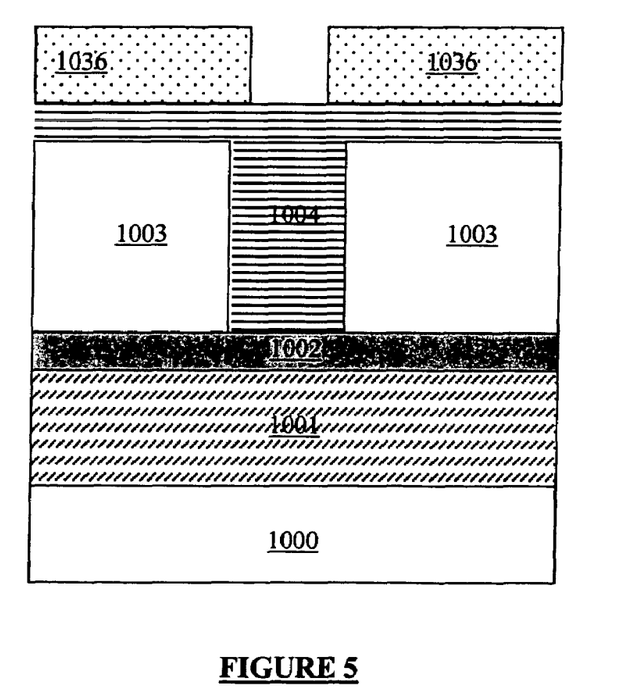

In FIG. 5, after the via 1007 is filled with the sacrificial material 1004, a photoresist layer 1036 is applied on top of the sacrificial material layer 1004, then patterned to define a trench formation region. The photoresist layer 1036 may be patterned using conventional photolithographic techniques. The photoresist layer 1036 may be inspected for accuracy and alignment prior to the trench formation process. Lithographic rework may be performed when the photoresist layer 1036 is not patterned or aligned accurately or correctly. For lithographic rework, the photoresist layer 1036 may be removed and a new photoresist layer (not shown) may be deposited and patterned.

In one embodiment, when there is need for lithographic rework (e.g., perhaps due to the fact that the photoresist layer 1036 is not formed or patterned correctly or accurately) the photoresist layer 1036 is removed using an ozonated organic acid solvent such as an ozonate acetic acid solution so that the photoresist layer 1036 is removed without affecting the sacrificial layer 1004. In one embodiment, the substrate 1000 with the photoresist layer 1036 is treated in a wet cleaning module with the ozonated organic acid solvent to remove the photoresist layer 1036 without affecting the sacrificial layer 1004. More details of the processes of selectively removing the photoresist without affecting the sacrificial material can be found in a co-pending patent application entitled "ORGANIC SOLVENTS HAVING OZONE DISSOLVED THEREIN FOR SEMICONDUCTOR PROCESSING UTILIZING SACRIFICIAL MATERIALS" by Steven Verhaverbeke, which has an attorney docket number AMAT 8907/W-C/W-C/JB1, and which is incorporated by reference herein by it entirety.

Figure 6:
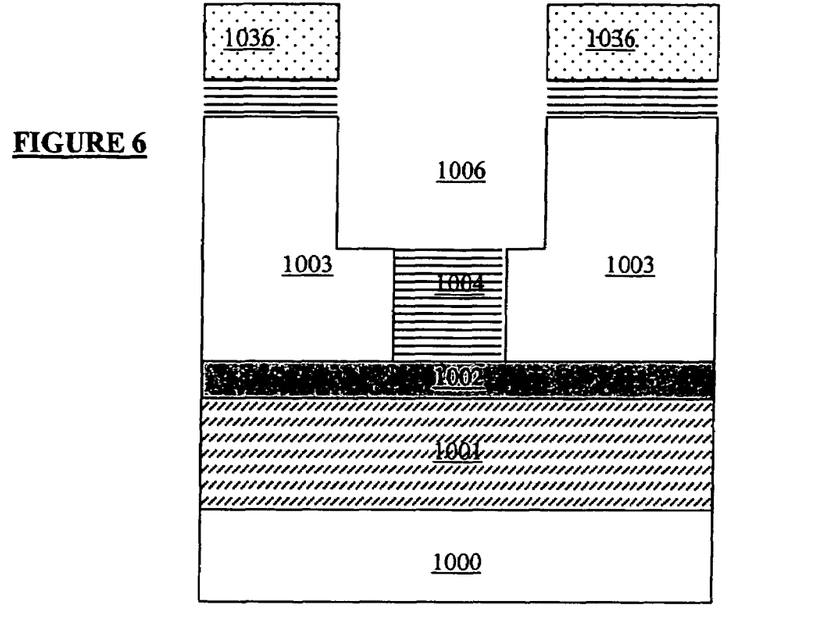

In FIG. 6, a trench 1006 is formed following the photoresist layer 1036 patterning and any necessary lithographic inspection and/or rework.

As shown in FIG. 6, the trench 1006 is etched into the dielectric layer 1003. The etching process is applied for a time sufficient to form the trench 1006 with a desired depth. In one embodiment, the etch chemistry chosen to etch the trench 1006 removes the sacrificial material 1004 at a slightly faster rate than it removes the dielectric layer 1003, to avoid formation of defects. The trench 1006 may be etched using the same equipment and etch chemistry that had been used previously to etch the via 1007. As with the via etch step, the barrier layer 1002 may act as an etch stop during the trench etching process, protecting the underlying conductive layer 1001 from the etch step and any subsequent ashing or cleaning steps. In addition, the presence of any portion of the sacrificial material 1004 that remains at the bottom of the via 1007 after the trench etch step may help ensure that the conductive layer 1001 will not be affected by the trench etch process.

Because forming the trench 1006 requires etching into the sacrificial material 1004 as well as the dielectric 1003, it is desirable that the sacrificial material and the dielectric material have similar material that have similar etching properties with the sacrificial material preferably has slightly faster etch rate than the dielectric material. Additionally, by filling the via 1007 with the sacrificial material 1004 that has dry etch characteristics like those of the dielectric layer 1003, the trench lithography process may effectively have a substantially "hole-free" surface, similar to one without the vias 1007. In one embodiment, the sacrificial material 1004 is selected so that it has an etch chemistry similar to the dielectric layer 1003 so that the trench 1006 may be etched into the dielectric layer 1003 at a rate that is almost as fast as the sacrificial material 1004 is removed. Such a process protects the underlying barrier layer 1002 during the trench 1006 etching. Such a process also permits the use of a trench etch chemistry that produces superior trench and via profiles without having to consider the effect such etch chemistry might have on the selectivity between the dielectric layer 1003 and the barrier layer 1002.

In an embodiment, the dielectric layer 1003 comprises silicon dioxide and the barrier layer 1002 comprises silicon nitride, an etch chemistry to be used to etch the trench 1006 should be one that does not provide a high selectivity to silicon dioxide and to silicon nitride. In addition, because the process of the present invention reduces the amount of time during which the barrier layer 1002 is etched during the trench etch process, the thickness of barrier layer 1002, e.g., a silicon nitride layer, when initially deposited, is only minimally reduced (e.g., only less than about 400-600 angstroms is etched).

Figure 7:
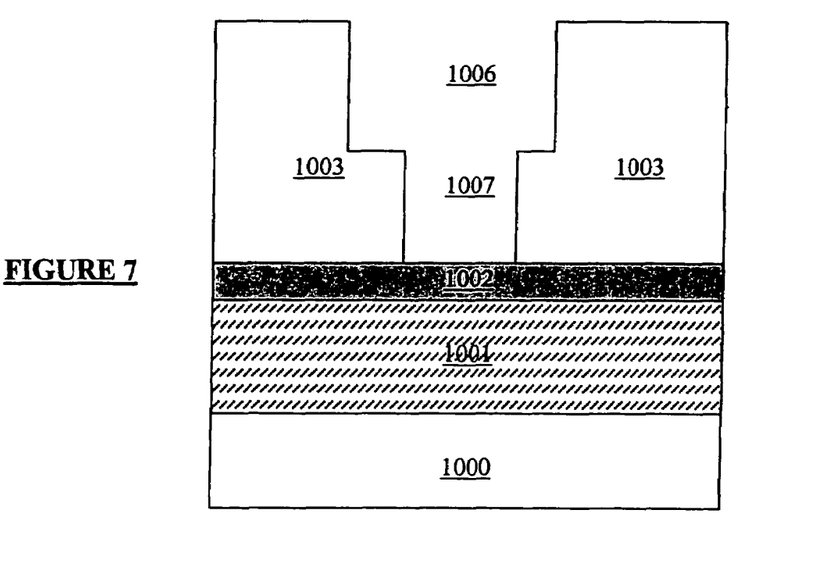
Figure 8:
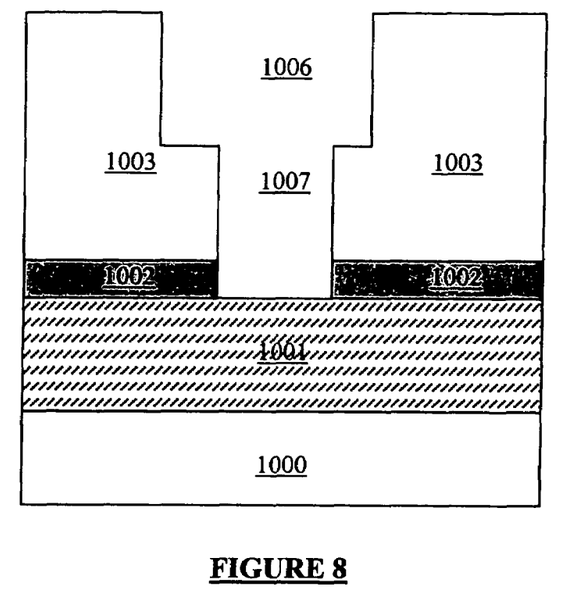

After the trench 1060 is etched, the photoresist 1036 and the sacrificial material 1004 and residues that may remain on the device's surface and inside the vias 1007 are removed or cleaned (FIG. 7). In one embodiment, the photoresist layer 1036 is removed using a dry stripping module (an exemplary embodiment of such a module is described herein and below) in which an energized hydrogen gas is used to remove the photoresist layer. In one embodiment, the energized hydrogen gas cleaning occurs at a temperature of about 100-250° C. a pressure less than 100 Torr (e.g., 1-10 Torr) and for about 2 minutes.

The sacrificial material 1004 is removed first treating the sacrificial material 1004 with an energized hydrogen gas (in a dry stripping module) and then treat the sacrificial material 1004 with a wet cleaning using a hydrogen fluoride solution in a wet cleaning module. In one embodiment, the wet cleaning is carried out using a diluted hydrogen fluoride solution containing about 1-6% hydrogen fluoride. In one embodiment, the energized hydrogen gas cleaning occurs at a temperature of about 200-250° C. a pressure less than 100 Torr (e.g., 1-10 Torr) and for about 2 minutes.

The barrier layer 1002 protects the first conductive layer 1001 from exposure to the solvents and/or oxidizing environment used when cleaning the trench. After the photoresist layer 1036 and the sacrificial material 1004 are removed, the barrier layer 1002 can be "partially removed" in which the portion of the barrier layer 1002 that separates the via 1007 from the first conductive layer is removed to expose the first conductive layer 1001 to form the structure shown in FIG. 8. The barrier layer 1002 can be removed using conventional method known those skilled in the art such as RIE (reactive ion etching). The barrier layer 1002 removal may be followed by a short wet etch (which employs an etch chemistry that is compatible with the material used to form conductive layer 1001) to clear etch residue from the surface of the conductive layer 1001. When copper is used to make the conductive layers, that portion of barrier layer 1002 should be removed, using a copper compatible chemistry, before any copper electroplating step is applied to fill the via 1007 and the trench 1006.

Figure 9:
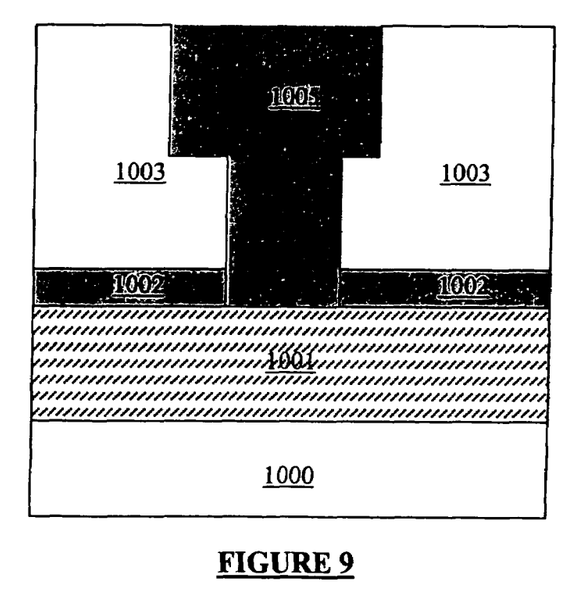

In FIG. 9, following the barrier layer 1002 partially removed, the trench 1006 and the via 1007 are filled with a second conductive layer 1005. The second conductive layer 1005 may comprise any of the materials identified above in connection with the first conductive layer 1001 (e.g., copper or copper formed over a copper/tantalum seed layer). The second conductive layer 1005 may comprise the same conductive material as the first conductive layer 1001, or may comprise a conductive material different from the material used to make the first conductive layer 1001. After the second conductive layer 1005 is formed, a CMP process may be used to planarize the surface of the second conductive layer 1005.

Figure 10:
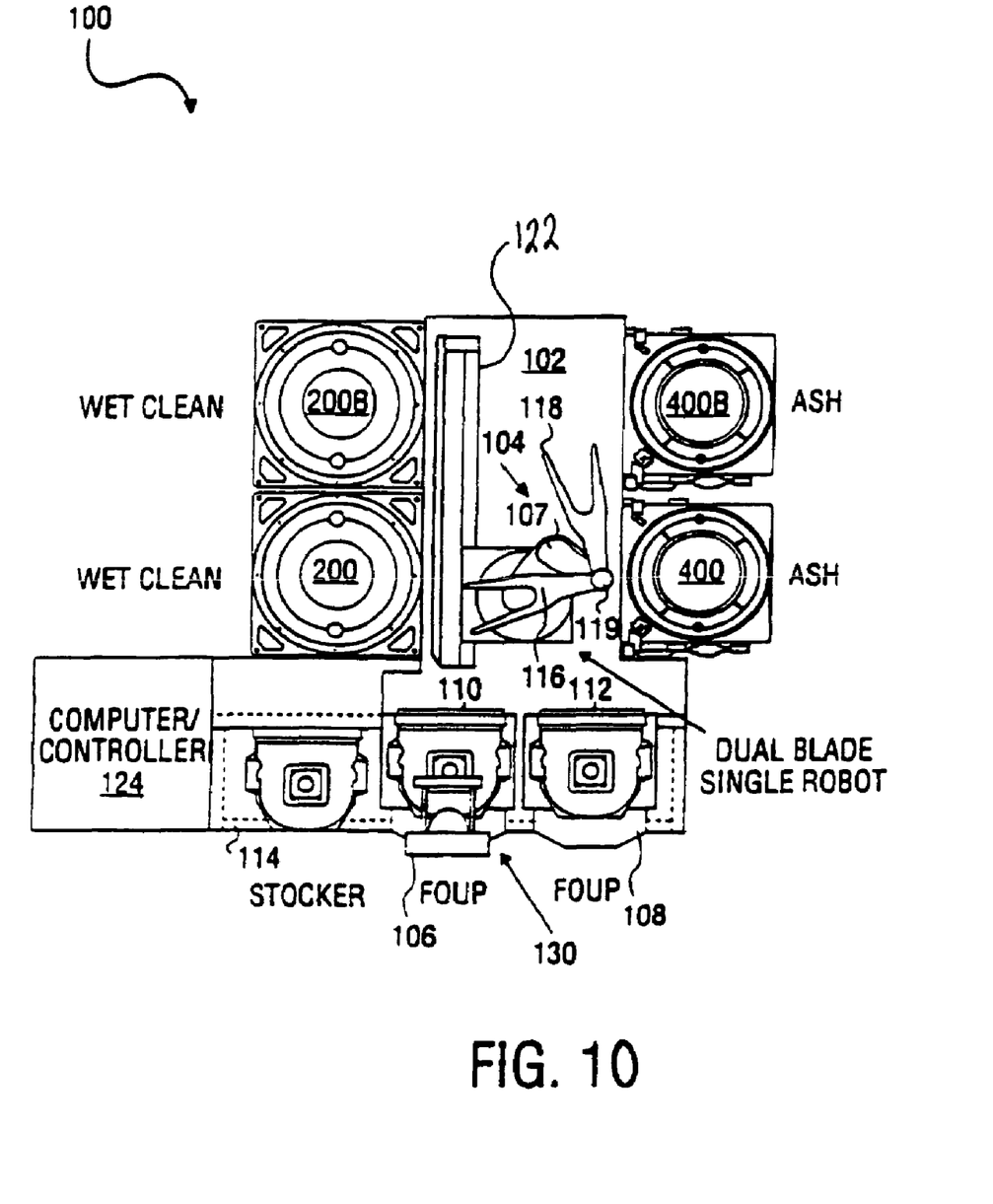
FIG. 10 illustrates an exemplary embodiment of a system that can be used to practice embodiments of the present invention.

FIG. 10 illustrates an apparatus or system 100 that can be used to practice various embodiments of the present invention. It is to be understood that other equipments or systems can be used to practice embodiments of the present invention and that the system 100 is only for illustration purpose and are not to be construed as limitations of the embodiments of the present invention. The system 100 can be used for a stripping (ashing) process previously mentioned, for instance, the first treatment in the removal process of the photoresist layer 1030, the photoresist layer 1036, or the sacrificial layer 1004. The system 100 can also be used for a wet cleaning process as previously mentioned, for instance, the second treatment in the removal process of the photoresist layer 1036 or the sacrificial layer 1004 or to remove or selectively remove the photoresist layer 1036 using an organic acid solvent having ozone dissolved therein when lithographic rework is necessary. The system 100 allows for the integration of two different cleaning modules so that the cleanings can be done in an efficient manner as well as maintaining the cleanings under the same atmospheric condition. The system 100 may be a part of a bigger system used for manufacturing of a semiconductor device or an integrated circuit.

In one embodiment, the system 100 includes a central transfer chamber 102 having a wafer-handling device 104 contained therein. The wafer to be transferred or processed can be the substrate 1000 previously described. Directly attached to the transfer chamber 102 is a single wafer wet cleaning module 200 and a strip (ash) module 400. The wet cleaning module 200 and the strip module 400 are each connected to the transfer chamber 102 through a separately closable opening. In an embodiment of the present invention, a second wet cleaning module 200B and/or a second strip (ash) module 400B are also coupled to the transfer chamber 102. In an embodiment of the present invention, the transfer chamber 102 is maintained at substantially atmospheric pressure (making it an atmospheric transfer chamber) during operation. In one embodiment, the module 200, 200B, 400, and 400B, each can be operated under substantially atmospheric condition thus the transfer chamber 102 can be maintained at such similar condition.

In an embodiment of the present invention, the atmospheric transfer chamber 102 can be opened or exposed to the atmosphere of a semiconductor fabrication "clean room" in which it is located. In such an embodiment, the transfer chamber 102 may contain an overhead filter, such as a hepafilter to provide a high velocity flow of clean air or an inert ambient such as nitrogen (N2), to prevent contaminants from finding their way into the atmospheric transfer chamber. In other embodiments, the atmospheric transfer chamber 102 is a closed system and may contain its own ambient, of clean air or an inert ambient, such as nitrogen gas.

The transfer chamber 102 includes a wafer handler (or wafer handling robot), which can transfer a wafer from one module to another. In an embodiment of the present invention, the wafer handler is a single robot 104 with two wafer handling blades 114 and 116 which both rotate about a single axis 119 coupled to the end of a single arm 120. The robot 104 can be said to be a dual blade single arm, single wrist robot. The robot 104 moves on a track 122 along a single axis in transfer chamber 102.

Also coupled to the transfer chamber 102 is at least one wafer input/output module 130 or pod for providing wafers to the system 100 and for taking wafers away from the system 100. In an embodiment of the present invention, the wafer input/output module 106 is a front opening unified pod (FOUP) which is a container having a slideable and sealable door and which contains a cassette of between 13-25 horizontally spaced wafers. The transfer chamber 102 contains a sealable access door 110, which slides vertically up and down or horizontally across to enable access into and out of the transfer chamber 102. In an embodiment of the present invention, the system 100 includes two FOUP's, 106 and 108 one for providing wafers into the system 100 and one for removing completed or processed wafers from the system 100. However, a wafer can be inputted and outputted from the same FOUP, if desired. A second access door 112 is provided to accommodate a second FOUP 108. Each access door can be attached to the counter part door on each FOUP so that when the transfer chamber access door 110 and 112 slides open, it opens the door of the FOUP to provide access for the robot into the FOUP. The FOUP's can be manually inserted onto the system 100 or a wafer stocking system 114, such as a Stocker, having multiple FOUP's in a rail system can be used to load and remove FOUP's from the system 100.

The system 100 may be configured to include or communicate with other processing modules such as a chemical vapor deposition module for depositing a film (e.g., a dielectric film or a sacrificial film, a conductive film), an etch module for forming the via or trench, and a photolithographic process tool for patterning the photoresist layer, etc. . . The system 100 may be configured so that the system 100 includes or can communicate to a sub-atmospheric platform to accommodate the processing modules that operate under a sub-atmospheric condition.

In one embodiment, a system computer 124 is coupled to and controls each of the wet clean module 200 and the strip module 400 (or other additional modules) as well as the operation of the transfer chamber 102 and the robot 104. The system computer 124 controls the operation of the system 100 such as the operation of each of the modules, the transfer chamber 102, the cleaning and drying processes that take place in any one of the modules, and the flow of a wafer (or a plurality of wafers) through the system 100 and/or to control the process within a different module.

Figure 11:
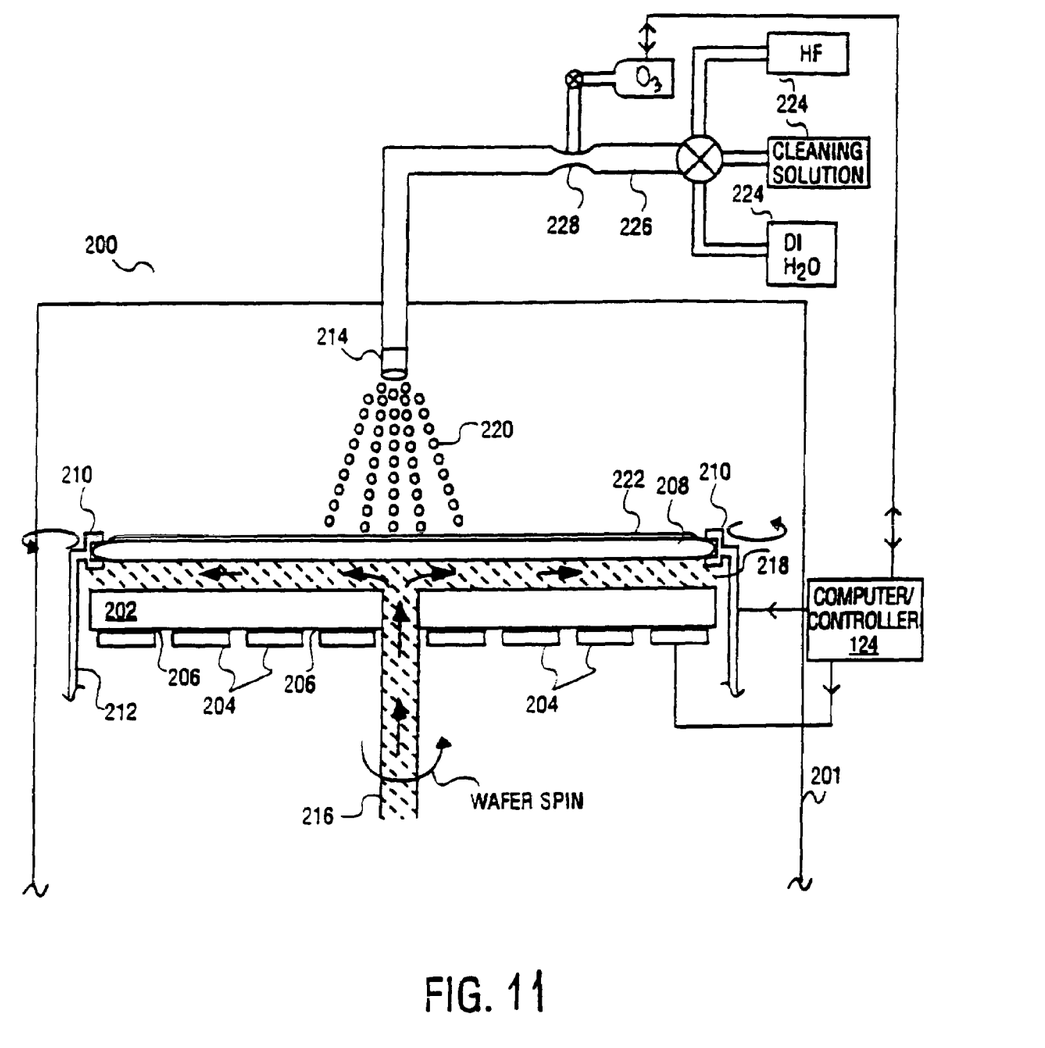
FIGS. 11-13 illustrate an exemplary embodiment of a wet cleaning module that can be part of the system shown in FIG. 10 that can be used to practice embodiments of the present invention.
Figure 12:
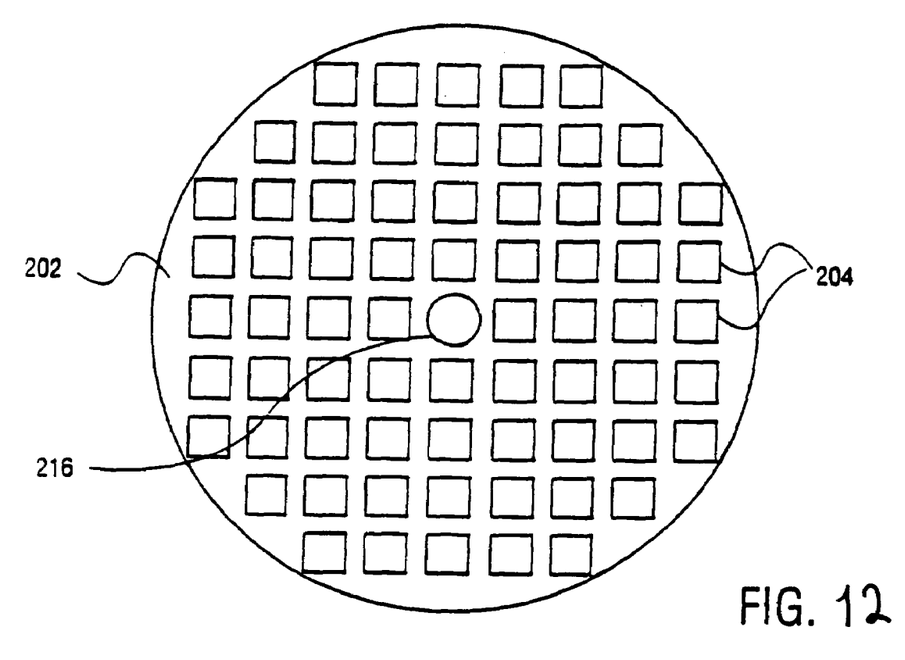
Figure 13:
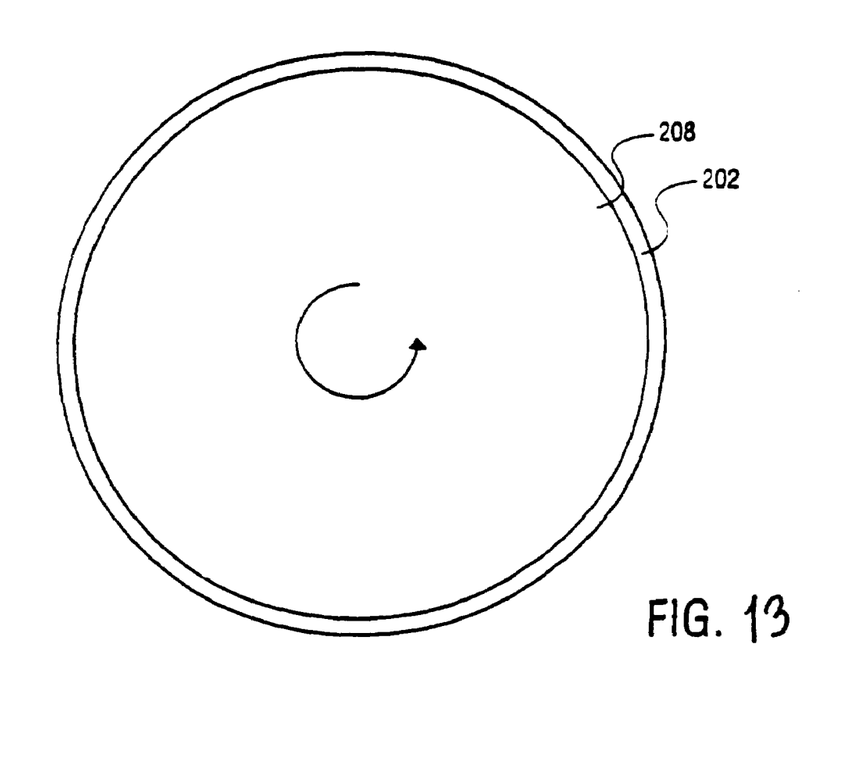

In one embodiment, the system computer 124 includes and/or can execute a machine or computer readable instructions that perform various methods (including the operations of the associated modules or apparatus) of fabricating a semiconductor devices in accordance to embodiments of the present invention. In one embodiment, the instructions perform a method that comprises creating a via in a dielectric layer formed on a substrate; filling the via, and optionally, the surface of the dielectric layer with a sacrificial material; forming and patterning a photoresist layer on the sacrificial material to define a trench for the semiconductor device; forming the trench; removing the photoresist layer after the trench is formed; and subjecting the substrate to plasma hydrogen gas for a predetermined amount of time followed by contacting a buffered hydrogen fluoride (HF) solution to the substrate to remove the sacrificial material without affecting the dielectric layer. In another embodiment, the method includes creating a via in a dielectric layer formed on a substrate; filling the via, and optionally, the surface of the dielectric layer with a sacrificial material; forming and patterning a photoresist layer on the sacrificial material to define a trench for the semiconductor device; forming the trench; removing the photoresist layer after the trench is formed; placing the substrate in a strip module and exposing the substrate to a hydrogen plasma for a predetermined amount of time; and removing the substrate from the strip module, placing the substrate in a wet cleaning module and dispensing a hydrogen fluoride (HF) solution over the substrate. The hydrogen plasma and the HF solution remove the sacrificial material without substantially affecting the dielectric layer. In another embodiment, the method includes removing a photoresist layer which further comprises subjecting the photoresist layer to a plasma hydrogen; and contacting the photoresist layer with a photoresist removal solution. In another embodiment, the method includes removing a sacrificial material layer comprises subjecting the sacrificial material layer to a plasma hydrogen; and contacting the sacrificial material layer with an etchant solution (e.g., hydrogen fluoride solution). In another embodiment, the method includes subjecting a substrate having formed thereon photoresist layer to a plasma hydrogen, the substrate further having formed thereon a sacrificial layer; contacting the photoresist layer with a photoresist removal solution; subjecting the sacrificial layer to a plasma hydrogen; and contacting the sacrificial material layer with an etchant solution An example of a single wafer cleaning module 200 which can be used as the wet cleaning module 200 and 200B is illustrated in FIGS. 11-13. FIGS. 11-13 illustrate a single wafer cleaning apparatus 200, which utilizes acoustic or sonic waves to enhance a cleaning. The single wafer cleaning apparatus 200 can be used to remove the photoresist layer 1036, in an embodiment, for lithographic rework, using an organic acid solvent having ozone dissolved therein. The single wafer cleaning apparatus 200 can also be used to clean the substrate 1000 throughout the processing whenever wet cleaning is required. The single wafer cleaning apparatus 200 can also be used to treat the photoresist layer and/or the sacrificial material in the second treatment after these layers have been treated with the energized hydrogen gas or hydrogen plasma treatment as previously mentioned.

The single wafer cleaning apparatus 200 shown in FIG. 11 includes a plate 202 with a plurality of acoustic or sonic transducers 204 located thereon. The plate 202 maybe made of aluminum but can be formed of other materials such as but not limited to stainless steel and sapphire. The plate 202 is maybe coated with a corrosion resistant fluoropolymer such as Halar or PFA. The transducers 204 are attached to the bottom surface of the plate 202 by an epoxy 206. In an embodiment of the present invention, the transducers 204 cover substantially the entire bottom surface of the plate 202 as shown in FIG. 12 and alternatively, cover at least 80% of the plate 202. The transducers 204 generate sonic waves in the frequency range e.g., between 400 kHz and 8 MHz. In an embodiment of the present invention the transducers 204 are piezoelectric devices. The transducers 204 create acoustic or sonic waves in a direction perpendicular to the surface of a wafer 208 that is placed in the single wafer cleaning apparatus 200.

A substrate or wafer 208 is held at distance of about 3 mm above the top surface of the plate 202. The wafer 208 can be the substrate 1000 or the substrate 2000 previously described.

The wafer 208 is clamped by a plurality of clamps 210 face up to a wafer support 212 which can rotate the wafer 208 about its central axis. The wafer support 212 can rotate or spin the wafer 208 about its central axis at a rate between 0-6000 rpm. In the apparatus 200, only the wafer support 212 and the wafer 208 are rotated during use whereas the plate 202 remains in a fixed position. Additionally, in the apparatus 200, the wafer 208 is placed face up wherein the side of the wafer with patterns or features such as transistors faces towards a nozzle 214 for spraying cleaning chemicals thereon and the backside of the wafer 208 faces the plate 202. Additionally, as shown in FIG. 13, the transducers covered plate 202 has a substantially same shape as the wafer 208 and the plate 202 covers the entire surface area of the wafer 208. The apparatus 200 can include a sealable chamber 201 in which the nozzle 214, the wafer 208, and the plate 202 are located as shown in FIG. 11.

In an embodiment of the present invention, during use, deionized water (DI-H2O) is fed through a feed through channel 216 of the plate 202 and fills the gap between the backside of the wafer 208 and the plate 202 to provide a water filled gap 218 through which acoustic waves generated by the transducers 204 can travel to the substrate 208. In an embodiment of the present invention DI water fed between the wafer 208 and the plate 202 is degassed so that cavitation is reduced in the DI water filled gap 218 where the acoustic waves are strongest thereby reducing potential damage to the wafer 208. In an alternative embodiment of the present invention, instead of flowing DI-H2O through the channel 216 during use, cleaning chemicals, such as the organic acid solvent having ozone dissolved therein, hydrogen fluoride solution, or sulfuric acid hydrogen peroxide solution can be fed through the channel 216 to fill the gap 218 to provide chemical cleaning of the backside of the wafer 208, if desired. Other suitable cleaning solvent can also be used.

Additionally during use, cleaning the chemicals and rinsing water such as DI-H2O, ozonated organic acid solvent, photoresist removal solution, or hydrogen fluoride are fed through a nozzle 214 to generate a spray 220 of droplets which form a liquid coating 222 on the top surface of the wafer 208, in one embodiment, while the wafer 208 is spun. In the present embodiment, the liquid coating 222 can be as thin as 50-150 micron. In one embodiment, one or more tanks 224 containing cleaning one ore more chemicals such as an organic acid solvent, acetic acid solvent, propionic acid solvent, and butyric acid solvent are coupled to the conduit 226, which feeds the nozzle 214. Alternatively, DI-H2O, HF, photoresist removal solution, or other suitable solution may also be coupled to the conduit 226 through the tanks 224. There may be more than three or less than three tanks 224 shown in FIG. 11. In an embodiment of the present invention the diameter of the conduit 226 has a reduced cross-sectional area or a "Venturi" 228 in a line before the nozzle 214 at which point a gas such as O3 (ozone) is dissolved in the solution as it travels to the nozzle 214. The Venturi 228 enables a gas to be dissolved into a fluid flow at gas pressure less than the pressure of the liquid flowing through the conduit 226. The Venturi 228 creates under pressure locally because of the increase in flow rate at the Venturi. The Venturi 228 and a gas source allow a treatment gas to be dissolved into a particular cleaning solution, which is particularly useful for certain cleaning process. For instance, the Venturi 228 and the gas source allow O3 to be dissolved into the organic acid solvent for selectively removing the photoresist layer. Other gases (e.g., N2 or H2) can also be used when suitable.

Figure 14:
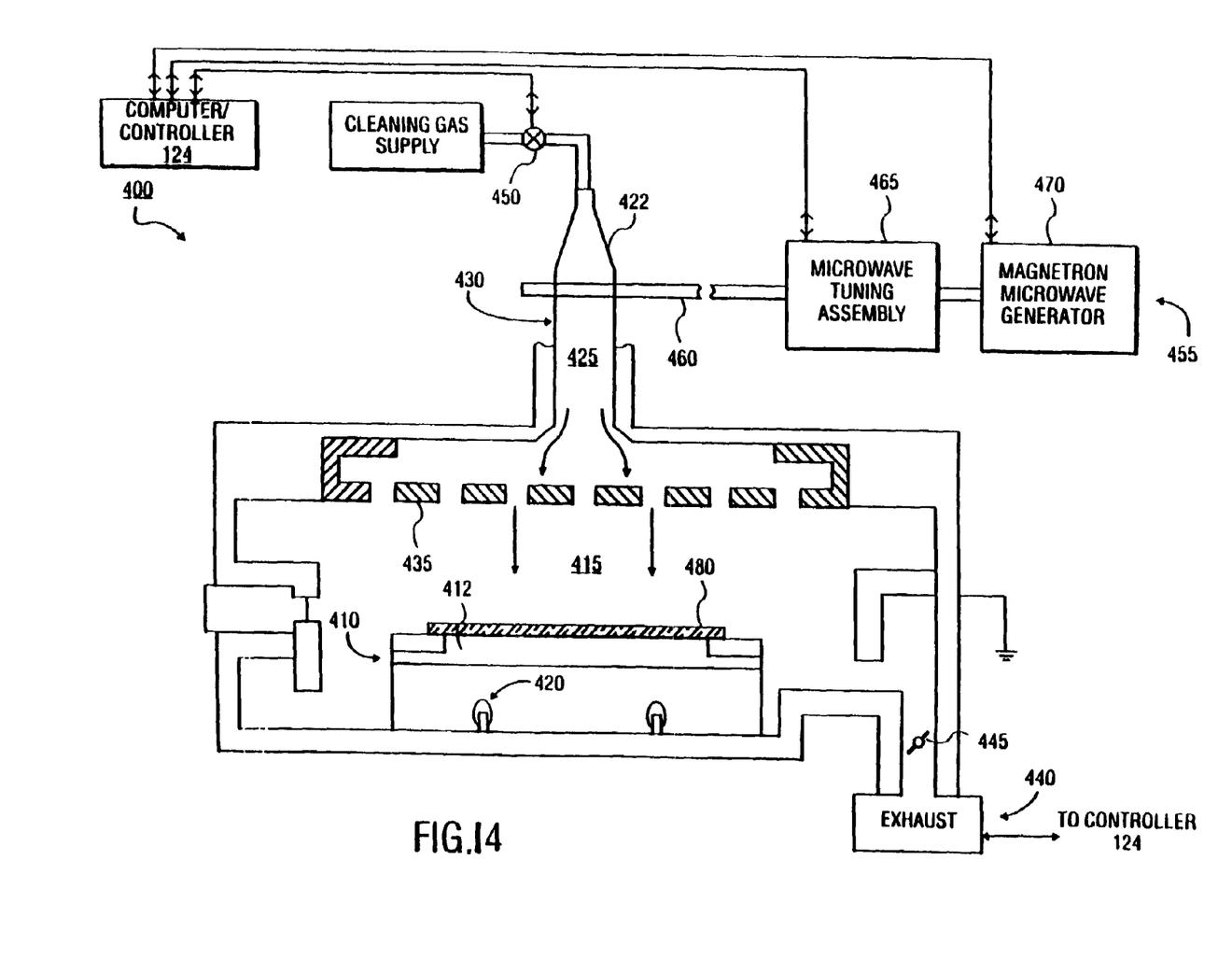
FIG. 14 illustrates an exemplary embodiment of a dry stripping module that can be part of the system shown in FIG. 10 that can be used to practice embodiments of the present invention.

FIG. 14 illustrates a strip or dry cleaning module 400 of the system 100 in accordance with an embodiment of the present invention. In the cleaning chamber 400 of the type illustrated in FIG. 14, an energized process gas comprising cleaning gas is provided to clean a substrate 480 held on a support 410 in a process zone 415. The support 410 supports the substrate 480 in the process zone 415 and may optionally comprise an electrostatic chuck 412. Within or below the support 410, a heat source, such as infrared lamps 420, can be used to heat the substrate 430. The process gas comprising a cleaning gas may be introduced through a gas distributor 422 into a remote plasma generation zone 425 in a remote chamber 430. By "remote" it is meant that the center of the remote chamber 430 is at a fixed upstream distance from the center of a process zone 415 in the cleaning chamber 400. In the remote chamber 430, the cleaning gas is activated by coupling microwave or radio frequency (RF) energy into the remote chamber 430, to energize the cleaning gas and cause ionization or dissociation of the cleaning gas components, prior to its introduction through a diffuser 435, such as a showerhead diffuser, into the process zone 415. Alternatively, the process gas may be energized in the process zone 415. Spent cleaning gas and residue may be exhausted from the cleaning chamber 400 through an exhaust system 440 capable of achieving a low pressure in the cleaning chamber 400. A throttle valve 425 in the exhaust 440 is used for maintaining a chamber pressure from about 150 mTorr to about 3000 mTorr.

In one embodiment, the remote chamber 430 comprises a tube shaped cavity containing at least a portion of the remote plasma zone 425. Flow of the cleaning gas into the remote chamber 430 is adjusted by a mass flow controller or gas valve 450. The remote chamber 430 may comprise wall made of a dielectric material such as quartz, aluminum oxide, or monocrystalline sapphire that is substantially transparent to microwave and is non-reactive to the cleaning gas. A microwave generator 455 is used to couple microwave radiation to the remote plasma zone 425 of the remote chamber 430. A suitable microwave generation 455 is an "ASTEX" Microwave Plasma Generator commercially available from Applied Science & Technology, Inc., Woburn, Massachusetts. The microwave generator assembly 455 may comprise a microwave applicator 460, a microwave tuning assembly 465, and a magnetron microwave generator 470. The microwave generator may be operated at a power level of about 200 to about 3000 Watts, and at a frequency of about 800 MHz to about 3000 MHz. In one embodiment, the remote plasma zone 425 is sufficiently distant from the process zone 415 to allow recombination of some of the dissociated or ionized gaseous chemical species. The resultant reduced concentration of free electrons and charged species in the activated cleaning gas minimizes charge-up damage to the active devices on the substrate 480, and provides better control of the chemical reactivity of the activated gas formed in the remote plasma zone 425. In another embodiment, the center of the remote plasma zone 425 is maintained at a distance of at least about 50 cm from the center of the process zone 415.

A cleaning process may be performed in the cleaning chamber 400 by exposing the substrate 480 to energized process gas comprising cleaning gas to treat the photoresist layer or the sacrificial material prior to removing them using the wet cleaning module. In one embodiment, the cleaning gas is hydrogen and when energized as previously described, the hydrogen gas may be referred to as hydrogen plasma. The hydrogen plasma can be used to treat a photoresist layer or a sacrificial layer during their removal process as previously described.

The following sections describe exemplary embodiments of using the system 100 to treat or clean certain layers (e.g., photoresist layer or sacrificial layer) from a substrate.

In one embodiment, a photoresist layer such as the photoresist layer 2001 on the substrate 2000 (FIGS. 1A-1B) is removed in accordance to embodiments of the present invention. Other photoresist layer includes those that are used during a dopant or ion implantation processes such that removal of the photoresist requires the photoresist to be removed without oxidizing or affecting the dopant concentration of the substrate. The photoresist layer 2001 is first treated with a hydrogen plasma in the strip module 400 of the system 100 and is then wet cleaned with a photoresist removal solution such as sulfuric acid hydrogen peroxide (SPM) solution in the wet cleaning module of the system 100. Thus, when a photoresist layer used during the fabrication process of a semiconductor device, such as the device 2000, where the photoresist layer needs to be removed without affecting (e.g., oxidizing) the substrate or its associated layers in a way that will cause lost of dopants, such photoresist layer can be removed using a hydrogen plasma followed by a wet cleaning process with a photoresist removal solution such as sulfuric acid hydrogen peroxide (SPM) solution. In one embodiment, in the hydrogen plasma treatment takes place in the strip module 400 of the system 100. In one embodiment, the wet cleaning process with the photoresist removal solution takes place in the wet cleaning module 200 of the system 100.

The substrate 2000 is shown in the chamber 400 as a wafer 480 (FIG. 14). The wafer 480 can be placed in the chamber 400 using the robot transfer assembly 104. According to an embodiment of the present invention, a cassette or FOUP of wafers including the substrate 2000 are placed in a docking station in the system 100. One or more of the wafers can be the substrate 2000. In one embodiment, the robot 104 removes the wafer 480 from the FOUP 130 and places the wafer 480 into the single wafer cleaning apparatus 400. The single wafer cleaning apparatus 400 is then sealed and the cleaning process begins. In one embodiment, the pressure of the single wafer cleaning apparatus 400 is substantially at atmospheric pressure.

The wafer 480 is exposed to an energized hydrogen gas. For a 5-liter process chamber 400, a suitable gas flow rate comprises 3000 to 3500 sccm of H2. Heating the substrate 480 may improve the removal rate of the photoresist layer and may also improve the removal rate of some etchant residue in some embodiments.

In one embodiment, the photoresist layer 2001 is treated with the hydrogen plasma for about 2 minutes at a temperature of about 100-250° C. and a pressure less than or equal to about 100 Torr. In one embodiment, the hydrogen gas is activated by coupling microwave or RF energy into the remote chamber 430 to energize the hydrogen gas and cause ionization or dissociation of the hydrogen gas prior to its introduction through the diffuser 435 and into the process zone 415. The hydrogen gas may be energized in the process zone 415, in another embodiment. The hydrogen gas flown into the remote chamber 430 can be adjusted by the mass flow controller gas valve 450. In one embodiment, the hydrogen gas is energized a power between about 200 to about 6000 Watts. The hydrogen plasma removes the crust portion 2001-C on the photoresist layer 2001 without oxidizing or causing lost to the dopant that may have been implanted in the substrate 2000 or other layers.

It is to be noted that the photoresist layer 2001 needs not be treated with the hydrogen plasma in the strip module 400 but can be treated with the hydrogen plasma using other known apparatus.

Following the hydrogen plasma treatment, the photoresist layer 2001 is treated with a photoresist removal solution in the wet chamber 200. In one embodiment, after the hydrogen plasma treatment, the substrate 2000 is removed from the chamber 400 and is placed in the wet cleaning module 200 (using the robot 104). In the chamber 200, the photoresist layer 2001 (the remaining bulk portion 2001-B) is treated with a photoresist removal solution such as the SPM solution. The wet cleaning may occur at a temperature of about 90-120° C. and at substantially atmospheric pressure. In one embodiment, the SPM solution includes 4 parts sulfuric acid and 1 part hydrogen peroxide. The SPM may be premixed as a mixture prior to being dispensed into the cleaning chamber 200.

In one embodiment, the substrate 2000 is placed on the plate 202 of the chamber 200 with the side of the photoresist layer 2001 facing upward toward the nozzle 214. (The substrate 2000 may be shown as the wafer 208 in FIG. 11). The transducer 204 is turned on. DI-H2O is fed through the channel 216 to fill the gap 218. The SPM solution is dispensed through the nozzle 214 to form a thin coating 222 on top of the substrate 2000 and the photoresist layer 2001. The substrate 2000 may be spun while the SPM solution is being dispensed. The substrate 2000 may be treated with the SPM solution for about 30 seconds to several minutes (e.g., 3 minutes) to completely remove the photoresist layer 2001.

It is to be noted that the photoresist layer 2001 needs not be treated with the SPM solution in the chamber 200 but can be contacted with the SPM solution by other methods such as rinsing, splashing, or immersing as is well known in the art.

The photoresist layer 1030 and 1036 can also be removed using similar processes as described for the photoresist layer 2001. Thus, during any particular process of the fabrication of the device, the substrate 1000 with the photoresist layer 1030 or the photoresist layer 1036 can be placed in the system 100, in the strip module 400 for the hydrogen plasma treatment, and then in the wet cleaning chamber 200 for the wet cleaning similar to previously described.

In one embodiment, the single wafer cleaning apparatus 200 of the system 100 is also used to selectively remove a photoresist layer such as the photoresist layer 1036 for lithographic rework (or other purposes) so that a new photoresist layer can be formed and patterned. Lithographic rework may be needed when the photoresist layer 1036 is not properly aligned or not correctly patterned. In one embodiment, the photoresist layer 1036 needs to be removed without affecting other layers especially the sacrificial layer 1004.

According to an embodiment of the present invention, a cassette or FOUP of wafers that need to be cleaned or treated are placed in a docking station in the apparatus 100. One or more of the wafers can be the substrate 1000 previously discussed. In one embodiment, the wafer 208 is the substrate 1000 previously described that has the photoresist layer 1036, which needs to be removed without affecting the sacrificial layer 1004. The robot 104 removes the wafer 208 from the FOUP 130 and places the wafer into the single wafer cleaning apparatus 200. The single wafer cleaning apparatus 200 is then sealed and the cleaning process begins. In one embodiment, the pressure of the single wafer cleaning apparatus 200 is substantially at atmospheric pressure.

In one embodiment, to selectively remove the photoresist layer 1036, an organic acid solvent (e.g., acetic acid, propionic acid, or butyric acid) having ozone gas dissolved therein is used to treat the photoresist layer 1036. After the wafer 208 (which in the present embodiment is the substrate 1000) is placed in the module 200, the organic acid solvent having the ozone dissolved therein is dispensed at the outlet 214 as the droplets 220 of ozone dissolved organic acid to form a thin coating 222 of ozone dissolved organic acid on top of the wafer 208. The wafer 208 is spun (for example at about 1000 rpm) while the ozone dissolved organic acid is being dispensed. In one embodiment, the ozone dissolved organic acid is a 99% acetic acid solution having ozone dissolved therein to about 100 ppm or greater (e.g., 200-400 ppm of ozone). In the present embodiment, the photoresist layer 1036 can be removed at a rate of about 5 μm/min at room temperature. The organic acid solvent having ozone dissolved therein may be dispensed over the wafer 208 for about 20 seconds to several minutes (e.g., 2-3 minutes) to remove the photoresist layer 1036 without affecting the sacrificial material (e.g., DUO or SLAM sacrificial material) 1004. A thicker photoresist layer 1036 would require a little more time for the cleaning.

In another embodiment, a small amount of HF is added to the organic acid solvent having ozone dissolved therein to remove contaminants that may have formed during the photoresist cleaning process. In one embodiment, about 2% of HF is included in the organic acid solvent having ozone dissolved therein.

The system 100 can also be used to remove a sacrificial material such as the sacrificial material 1004 in accordance to embodiments of the present invention. The sacrificial material 1004 is first treated with a hydrogen plasma in the strip module 400 of the system 100 and is then wet cleaned with an etching solution such as hydrogen fluoride solution in the wet cleaning module of the system 100.

In one embodiment, the sacrificial material 1004 is treated with the hydrogen plasma for about 2 minutes at a temperature of about 200-250° C. and a pressure less than or equal to about 100 Torr. Similar to previously described, the substrate 1000 is placed in the dry strip module 400 using the robot 104. The hydrogen plasma may react with the organic compound of the sacrificial material to effect the removal of the sacrificial material. After the hydrogen plasma treatment, the substrate 1000 is removed from the chamber 400 and is placed in the wet cleaning module 200 similar to previously described and is treated with an etching solution such as hydrogen fluoride to completely remove the sacrificial material. In one embodiment, the hydrogen fluoride in the wet cleaning process removes the oxide portion of the sacrificial material 1004. The wet cleaning may occur at a temperature of about 90-120° C. and at substantially atmospheric pressure.

In one embodiment, the substrate 1000 is shown in the chamber 400 as a wafer 480 (FIG. 14). The wafer 480 can be placed in the chamber 400 using the robot transfer assembly 104. According to an embodiment of the present invention, a cassette or FOUP of wafers including the substrate 1000 are placed in a docking station in the system 100. One or more of the wafers can be the substrate 2000. In one embodiment, the robot 104 removes the wafer 480 from the FOUP 130 and places the wafer 480 into the single wafer cleaning apparatus 400. The single wafer cleaning apparatus 400 is then sealed and the cleaning process begins. In one embodiment, the pressure of the single wafer cleaning apparatus 400 is substantially at atmospheric pressure.

The wafer 480 is exposed to an energized hydrogen gas. For a 5-liter process chamber 400, a suitable gas flow rate comprises 3000 to 3500 sccm of H2. Heating the substrate 480 may improve the removal rate of the sacrificial layer.

In one embodiment, the sacrificial layer 1004 is treated with the hydrogen plasma for about 2 minutes at a temperature of about 100-250° C and a pressure less than or equal to about 100 Torr. In one embodiment, the hydrogen gas is activated by coupling microwave or RF energy into the remote chamber 430 to energize the hydrogen gas and cause ionization or dissociation of the hydrogen gas prior to its introduction through the diffuser 435 and into the process zone 415. The hydrogen gas may be energized in the process zone 415, in another embodiment. The hydrogen gas flown into the remote chamber 430 can be adjusted by the mass flow controller gas valve 450. In one embodiment, the hydrogen gas is energized a power between about 200 to about 6000 Watts. The hydrogen plasma reacts with the organic compound of the sacrificial layer 1004 to remove the organic compound from the layer 1004.

Following the hydrogen plasma treatment, the wafer is moved from the chamber 400 into the chamber 200 for wet cleaning. The wafer is placed on the plate 202 of the chamber 200 with the side of the photoresist layer 2001 facing upward toward the nozzle 214. The transducer 204 is turned on. DI-H2O is fed through the channel 216 to fill the gap 218. The HF solution is dispensed through the nozzle 214 to form a thin coating 222 on top of the wafer. The wafer may be spun while the HF solution is being dispensed. The wafer may be treated with the HF solution for about 30 seconds to several minutes (e.g., 2-3 minutes) to completely remove the sacrificial layer 1004.

It is to be noted that the photoresist layer 2001 needs not be treated with the hydrogen plasma in the strip module 400 but can be treated with the hydrogen plasma using other known apparatus. It is also to be noted that the sacrificial layer 1004 needs not be treated with the HF solution in the chamber 200 but can be contacted with the HF solution by other methods such as rinsing, splashing, or immersing as is well known in the art.

In any of the embodiments of the present invention, the dispensing of the ozone dissolved organic acid, the mixing of the acetic acid and the ozone, the dispensing rate of the ozone dissolved organic acid, the dispensing of the HF solution, the dispensing or mixing of the photoresist removal (e.g., SPM) solution, the hydrogen plasma generation, the spinning rate of the wafer 208, as well as other operations associated with the apparatus 200 or 400 can be controlled by the system computer 124.

Although the foregoing description has specified certain steps, materials, and equipments that may be used in such a method to make such an integrated circuit, those skilled in the art will appreciate that many modifications and substitutions may be made. For example, although the embodiments have been described in the context of making a dual damascene device, the invention is not limited to that particular application. Accordingly, it is intended that all such modifications, alterations, substitutions and additions be considered to fall within the spirit and scope of the invention as defined by the appended claims.

I claim:

1. A method of fabricating a semiconductor device comprising:

providing a substrate;

forming a gate dielectric layer on the substrate;

forming a gate electrode on the dielectric layer;

forming a first photoresist layer on the substrate to define a source and drain regions in the substrate;

forming the source and drain regions in the substrate, wherein forming the source and drain regions comprises implanting dopants into the source and drain regions in the substrate, and wherein implanting dopants forms a top crust layer of the first photoresist layer; and removing the first photoresist layer after the source and drain regions are formed, wherein removing the first photoresist layer further includes subjecting the substrate to hydrogen plasma to remove the top crust layer of the first photoresist layer without causing oxidation of the substrate, gate dielectric layer, or gate electrode, and then contacting the first photoresist layer with a photoresist removal solution to remove the bulk of the first photoresist layer.

2. The method of claim 1 wherein the photoresist removal solution includes sulfuric acid-hydrogen peroxide solution.

3. A method of fabricating a semiconductor device comprising:
 providing a substrate;
 forming a gate dielectric layer on the substrate;
 forming a gate electrode on the dielectric layer;
 forming a first photoresist layer on the substrate to define a source and drain regions in the substrate and forming the source and drain regions in the substrate;
 removing the first photoresist layer after the source and drain regions are formed, wherein removing the first photoresist layer further includes subjecting the substrate to hydrogen plasma and then contacting the first photoresist layer with a photoresist removal solution to remove the first photoresist layer;
 forming a dielectric layer on the substrate, wherein the substrate includes source and drain regions, the gate dielectric layer, and the gate electrode formed thereon;
 creating a via in the dielectric layer formed on a substrate;
 filling the via, and optionally, the surface of the dielectric layer with a sacrificial material;
 forming and patterning a second photoresist layer on the sacrificial material to define a trench for the semiconductor device;
 forming the trench;
 removing the second photoresist layer after the trench is formed; and
 removing the sacrificial material after removing the second photoresist, wherein removing the sacrificial material further includes subjecting the substrate to plasma hydrogen gas for a predetermined amount of time followed by contacting a buffered hydrogen fluoride (HF) solution to the substrate to remove the sacrificial material without substantially affecting the dielectric layer.

4. The method of claim 3 wherein the second photoresist layer is removed using an organic acid solvent comprising ozone.

5. The method of claim 4 wherein a hydrogen fluoride solution is added to the organic acid solvent comprising ozone.

6. The method of claim 3 wherein the second photoresist layer is removed using a treatment solution having about 99% acetic acid and ozone of about 100 ppm or higher concentration.

7. The method of claim 3 wherein removing the second photoresist further comprises one of contacting the substrate with an acetic acid having ozone dissolved therein solution, contacting the substrate with an propionic acid having ozone dissolved therein solution, and contacting the substrate with an butyric acid having ozone dissolved therein solution.

8. The method of claim 3 wherein removing the second photoresist layer further comprises treating the substrate with hydrogen plasma.

9. The method of claim 1 wherein the plasma hydrogen consists essentially of activated hydrogen gas.

10. The method of claim 1 wherein subjecting the substrate to hydrogen plasma further comprises subjecting the substrate to hydrogen plasma at a temperature of about 100-250° C.

11. The method of claim 1 wherein subjecting the substrate to hydrogen plasma further comprises energizing a hydrogen gas at a power between 200 and 6000 Watts.

12. A method of fabricating a semiconductor device comprising:
 providing a substrate;
 forming a gate dielectric layer on the substrate;
 forming a gate electrode on the dielectric layer;
 forming a first photoresist layer on the substrate to define a source and drain regions in the substrate and forming the source and drain regions in the substrate; and
 removing the first photoresist layer after the source and drain regions are formed, wherein removing the first photoresist layer further includes subjecting the substrate to hydrogen plasma to remove a top layer of the first photoresist layer and then contacting the first photoresist layer with a photoresist removal solution to remove the bulk of the first photoresist layer;
 forming a dielectric layer over the source and drain regions, gate dielectric layer, and the gate electrode;
 creating a via in the dielectric layer;
 filling the via, and optionally, the surface of the dielectric layer with a sacrificial material;
 forming and patterning a second photoresist layer on the sacrificial material to define a trench for the semiconductor device;
 forming the trench;
 removing the second photoresist layer after the trench is formed; and
 removing the sacrificial material after removing the second photoresist, wherein removing the sacrificial material further includes subjecting the substrate to plasma hydrogen gas for a predetermined amount of time followed by contacting a buffered hydrogen fluoride (HF) solution to the substrate to remove the sacrificial material without substantially affecting the dielectric layer.

13. The method of claim 12 wherein the second photoresist layer is removed using an organic acid solvent comprising ozone.

14. The method of claim 13 wherein a hydrogen fluoride solution is added to the organic acid solvent comprising ozone.

15. The method of claim 12 wherein the second photoresist layer is removed using a treatment solution having about 99% acetic acid and ozone of about 100ppm or higher concentration.

16. The method of claim 12 wherein removing the second photoresist further comprises one of contacting the substrate with an acetic acid having ozone dissolved therein solution, contacting the substrate with an propionic acid having ozone dissolved therein solution, and contacting the substrate with an butyric acid having ozone dissolved therein solution.

17. The method of claim 12 wherein removing the second photoresist layer further comprises treating the substrate with hydrogen plasma.

* * * * *